(12) United States Patent
Shakh et al.

(10) Patent No.: US 11,227,990 B2
(45) Date of Patent: Jan. 18, 2022

(54) MAGNETIC MEMORY STRUCTURE

(71) Applicant: INDUSTRIAL TECHNOLOGY RESEARCH INSTITUTE, Hsinchu (TW)

(72) Inventors: Ziaur Rahaman Shakh, Zhudong Township (TW); I-Jung Wang, Zhudong Township (TW); Jeng-Hua Wei, Taipei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 16/514,523

(22) Filed: Jul. 17, 2019

(65) Prior Publication Data

US 2021/0020827 A1 Jan. 21, 2021

(51) Int. Cl.
*H01L 27/22* (2006.01)
*H01L 43/02* (2006.01)
(Continued)

(52) U.S. Cl.
CPC .......... *H01L 43/02* (2013.01); *G11C 11/161* (2013.01); *G11C 11/1673* (2013.01); *G11C 11/1675* (2013.01); *H01F 10/329* (2013.01); *H01F 10/3259* (2013.01); *H01L 27/228* (2013.01); *H01L 43/10* (2013.01)

(58) Field of Classification Search
CPC ....... H01L 43/02; H01L 27/228; H01L 43/10; H01L 27/222–228; G11C 11/161; G11C 11/1673; G11C 11/1675; G11C 2211/5615–5616; G11C 11/14–1697; H01F 10/3259; H01F 10/329; H01F 1/00–447

See application file for complete search history.

(56) References Cited

U.S. PATENT DOCUMENTS 8,716,818 B2 5/2014 Yoshikawa et al.
8,963,222 B2 2/2015 Guo
(Continued)

FOREIGN PATENT DOCUMENTS

TW 201709578 A 3/2017
TW 201729442 A 8/2017
(Continued)

OTHER PUBLICATIONS

Avci et al., "Current-induced switching in a magnetic insulator", Nature Materials, Nov. 21, 2016, pp. 1-7.
(Continued)

*Primary Examiner* — Shahed Ahmed
(74) *Attorney, Agent, or Firm* — Birch, Stewart, Kolasch & Birch, LLP (57) ABSTRACT

A magnetic memory structure is provided. The magnetic memory structure includes a magnetic tunneling junction (MTJ) layer and a heavy-metal layer. The MTJ layer includes a pinned-layer, a barrier-layer formed under the pinned-layer and a free-layer formed under the barrier-layer. The heavy-metal layer is formed under the free-layer. The barrier-layer has a first upper surface, the pinned-layer has a lower surface, and area of the first upper surface is larger than area of the lower surface.

10 Claims, 6 Drawing Sheets

(51) Int. Cl.
*H01F 10/32* (2006.01)
*G11C 11/16* (2006.01)
*H01L 43/10* (2006.01)

(56) References Cited

U.S. PATENT DOCUMENTS

| | | | |
|---|---|---|---|
| 9,324,403 | B2 | 4/2016 | Khalili Amiri et al. |
| 9,646,670 | B2 | 5/2017 | Lee et al. |
| 9,691,458 | B2 | 6/2017 | Ralph et al. |
| 9,830,968 | B2 | 11/2017 | Shimomura et al. |
| 9,947,382 | B2 | 4/2018 | Buhrman et al. |
| 2014/0252439 | A1 | 9/2014 | Guo |
| 2015/0029779 | A1* | 1/2015 | Lee .................. H01L 43/02 365/148 |
| 2016/0202330 | A1* | 7/2016 | Yamamoto .......... G01R 33/098 324/252 |
| 2017/0117027 | A1 | 4/2017 | Braganca et al. |
| 2018/0040807 | A1 | 2/2018 | Saito et al. |
| 2018/0040811 | A1* | 2/2018 | Lee .................. H01L 43/10 |
| 2019/0074044 | A1* | 3/2019 | Atulasimha ......... G11C 11/161 |
| 2020/0212291 | A1* | 7/2020 | Lin ................... H01F 10/3218 |
| 2020/0312391 | A1* | 10/2020 | Sun .................... G11C 11/1675 |

FOREIGN PATENT DOCUMENTS

| | | |
|---|---|---|
| TW | 201806206 A | 2/2018 |
| TW | I634680 B | 9/2018 |

OTHER PUBLICATIONS

Cubukcu et al., "Ultra-Fast Perpendicular Spin-Orbit Torque MRAM", IEEE Transactions on Magnetics, vol. 54, No. 4, Apr. 2018, 4 pages.
Fukami et al., "A spin-orbit torque switching scheme with collinear magnetic easy axis and current configuration", Nature Nanotechnology, vol. 11, Jul. 2016, pp. 621-625.
Garello et al., "Symmetry and magnitude of spin-orbit torques in ferromagnetic heterostructures", Nature Nanotechnology, vol. 8, Aug. 2013, pp. 587-593.
Hirsch, J. E., "Spin Hall Effect", Physical Review Letters, vol. 83, No. 9, Aug. 30, 1999, pp. 1834-1837.
Jungwirth et al., "Spin Hall effect devices", Nature Materials, vol. 11, May 2012, pp. 382-390.
Liu et al., "Current-Induced Switching of Perpendicularly Magnetized Magnetic Layers Using Spin Torque from the Spin Hall Effect", Physical Review Letters, vol. 109, Aug. 31, 2012, pp. 096602-1-096602-5.
Liu et al., "Spin-Torque Switching with the Giant Spin Hall Effect of Tantalum", Science, vol. 336, May 4, 2012, pp. 555-558.
Miron et al., "Perpendicular switching of a single ferromagnetic layer induced by in-plane current injection", Nature, vol. 476, Aug. 11, 2011, pp. 189-193.
Morota et al., "Indication of intrinsic spin Hall effect in 4d and 5d transition metals", Physical Review B, vol. 83, 2011, pp. 174405-1-174405-5.
Pai et al., "Spin transfer torque devices utilizinq the giant spin Hall effect of tungsten", Applied Physics Letters, vol. 101, 2012, pp. 122404-1-122404-4.

* cited by examiner

MAGNETIC MEMORY STRUCTURE

TECHNICAL FIELD

The present invention relates generally to a magnetic random access memory structure, and to spin-orbit torque magnetic random access memory with voltage controlled magnetic anisotropy effects.

BACKGROUND

The magnetic random access memory (MRAM) based on magnetic tunnel junction (MTJ) storage devices, which consists of two ferromagnetic layers separated by a magnetic insulating barrier have emerged as very promising candidates for future high performance nonvolatile memory and logic applications. In particular, the spin-transfer torque magnetic random access memory (STT-MRAM) has attracted much attention because of its CMOS compatibility, excellent nonvolatility, high writing and reading speed, and zero leakage power. It has been also identified as a good candidate for the low-level cache memory, embedded flash of the system-on-chip processor, and as an ideal one-memory-for-all for small battery-operated appliances such as the Internet of Things (IoT).

Although STT-MRAM has attracted considerable attention worldwide due to its unique features, some significant challenges have to be addressed before this technology being commercialized. The technology is mature to the stage that silicon foundries are producing them. Despite its maturity, there is room for further improvement of its robustness. One of the major drawback of the STT-MRAM technology is its reliability issues such as read disturbance, read/write errors, retention, and possible oxide breakdown due to the identical read/write access paths.

To mitigate the reliability issues of STT-MRAM, spin-orbit torque MRAM (SOT-M RAM) with isolated read/write paths is considered as a possible solution. The advantage of three terminal MTJ based SOT-MRAM over two terminal MTJ based STT-M RAM is that read and write path are perpendicular to each other which intrinsically solves the reliability and tunnel barrier degradation issues, provides a new pathway for cache memory applications.

SUMMARY

According to one embodiment of this disclosure, a magnetic memory structure is provided. The magnetic memory structure includes a magnetic tunneling junction (MTJ) layer and a heavy-metal layer. The MTJ layer includes a pinned-layer, a barrier-layer formed under the pinned-layer and a free-layer formed under the barrier-layer. The heavy-metal layer is formed under the free-layer. The barrier-layer has a first upper surface, the pinned-layer has a lower surface, and area of the first upper surface is larger than area of the lower surface.

According to another embodiment of this disclosure, a magnetic memory structure is provided. The magnetic memory structure includes a MTJ layer, a heavy-metal layer formed under the MTJ layer and a conductive layer formed under the heavy-metal layer. The conductive layer has an electric conductivity higher than that of the heavy-metal layer.

The above and other aspects of this disclosure will become better understood with regard to the following detailed description of the preferred but non-limiting embodiments. The following description is made with reference to the accompanying drawings.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 1:
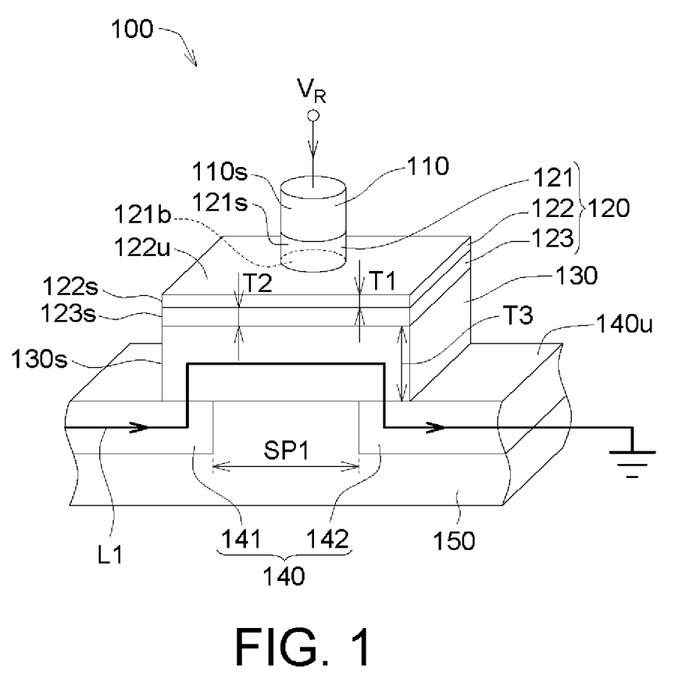
FIGS. 1 and 2 illustrate a schematic diagram of a magnetic memory structure according to an embodiment of the present disclosure.
Figure 2:
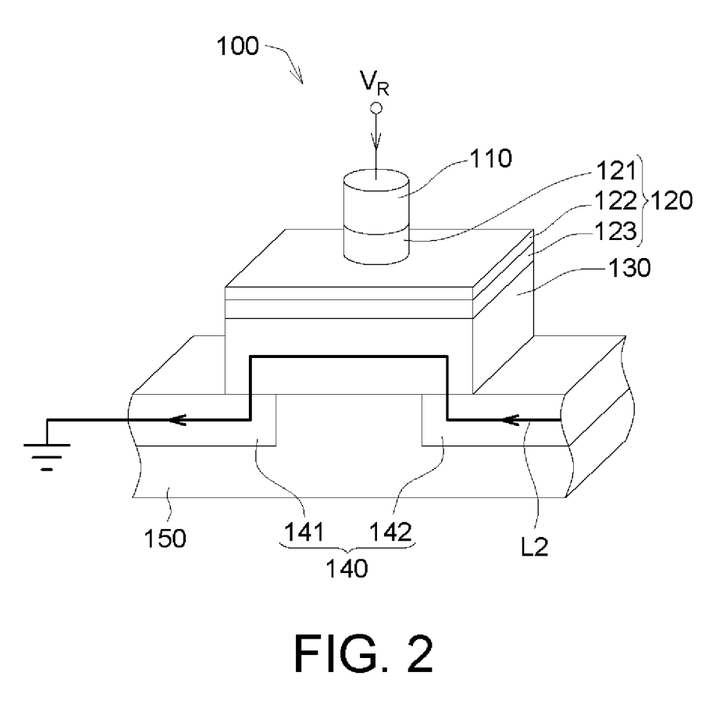
Figure 3:
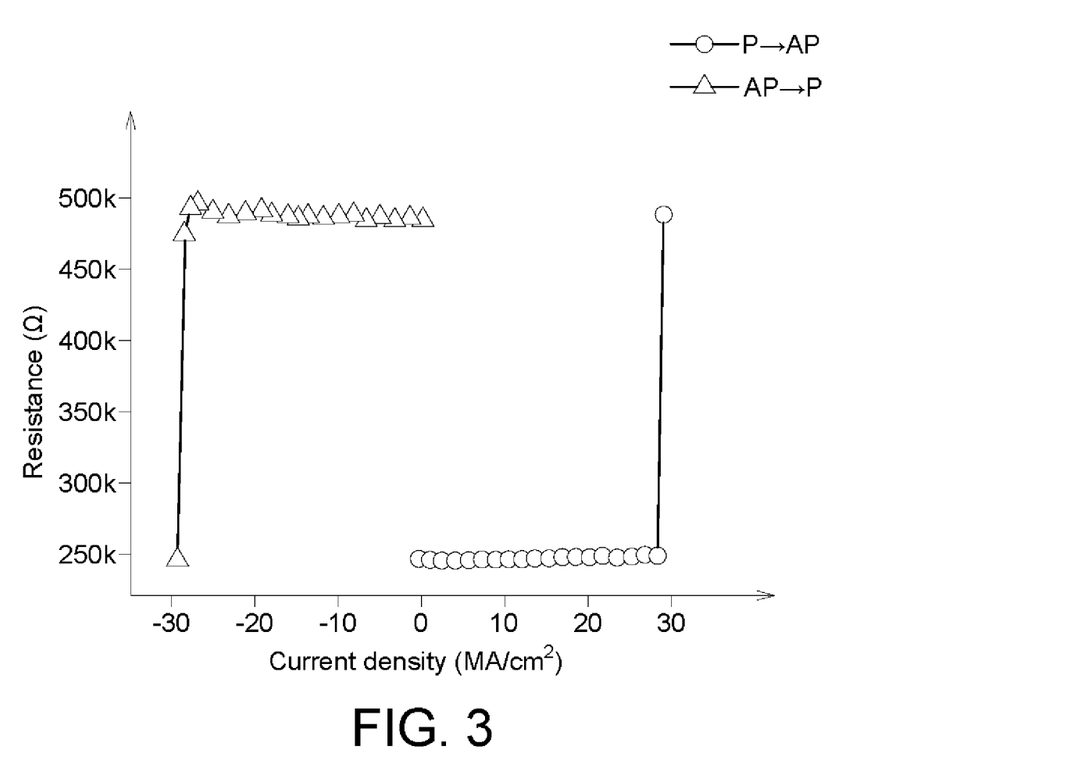
FIG. 3 illustrates a schematic diagram of resistance versus current density (R-J) curve for the magnetic memory structure.

Referring to FIGS. 1 to 3, FIGS. 1 and 2 illustrate a schematic diagram of a magnetic memory structure 100 according to an embodiment of the present disclosure, and FIG. 3 illustrates a schematic diagram of resistance versus current density (R-J) curve for the magnetic memory structure 100.

The magnetic memory structure 100 is a kind of magnetic random access memory (MRAM), for example, a spin-orbit torque (SOT)-MRAM. The magnetic memory structure 100 includes a top electrode 110, a magnetic tunneling junction (MTJ) layer 120, a heavy-metal layer 130, a conductive layer 140 and an insulation layer 150.

The top electrode 110 is formed on and above the MTJ layer 120. The top electrode 110 is configured to receive a read voltage $V_R$ applied by a voltage source (not illustrated) for read the state of the MTJ layer 120.

The MTJ layer 120 includes a pinned-layer 121, a barrier-layer 122 and a free-layer 123. The barrier-layer 122 is formed under the pinned-layer 121, and the free-layer 123 is formed under the barrier-layer 122, that is, the barrier-layer 122 lies between the pinned-layer 121 and the free-layer 123.

The top electrode 110 and the pinned-layer 121 of the MTJ layer 120 have a lateral surface 110s and a lateral surface 121s respectively. In one etching process, the top electrode 110 and the pinned-layer 121 are etched, by the same mask, to form the lateral surfaces 110s and 121s, and thus the lateral surfaces 110s and 121s are substantially aligned with each other. As shown in FIG. 1, the top electrode 110 and the pinned-layer 121 are shaped into the same elliptic shape.

In addition, the barrier-layer 122 has a first upper surface 122u, the pinned-layer 121 has a lower surface 121b, wherein area of the first upper surface 122u is larger than area of the lower surface 121b. As illustrated in FIG. 1, the lower surface 121b of the pinned-layer 121 is entirely located at the first upper surface 122u of the barrier-layer 122.

Since the barrier-layer 122 is made of a material different form that of the pinned-layer 121, the barrier-layer 122 could serve as an etching stop layer for obtaining accurate thicknesses of the pinned-layer 121 and/or the barrier-layer 122. To provide etching stop-on-barrier, the first upper surface 122u of the barrier-layer 122 is larger than the lower surface 121b of the pinned-layer 121. In an embodiment, the barrier-layer 122 is made of an insulation material including Mg, oxygen or combination thereof which is different form magnetic material of the pinned-layer 121.

As illustrated in FIG. 1, the heavy-metal layer 130 is formed under the free-layer 123. The barrier-layer 122, the free-layer 123 and the heavy-metal layer 130 have a first lateral surface 122s, a second lateral surface 123s and a third lateral surface 130s respectively. In one etching process, the barrier-layer 122, the free-layer 123 and the heavy-metal layer 130 are etched, by the same mask, to form the first lateral surface 122s, the second lateral surface 123s and the third lateral surface 130s, and thus the first lateral surface 122s, the second lateral surface 123s and the third lateral surface 130s are substantially aligned (or flush) with each other. As shown in FIG. 1, the barrier-layer 122, the free-layer 123 and the heavy-metal layer 130 are shaped into the same polygonal shape, for example, rectangular shape or square shape.

In some embodiments, the pinned layer 121 may include a single layer or a composite layer. In some embodiments, the pinned layer 121 may include a single layer of, for example, cobalt iron (CoFe) alloy, cobalt iron boron (CoFeB) alloy, or cobalt nickel (CoNi) alloy. In some embodiments, the pinned layer 121 may include a composite layer of, for example, cobalt (Co)/platinum (Pt), cobalt (Co)/nickel (Ni), or cobalt (Co)/palladium (Pd).

In some embodiments, the barrier-layer 122 may include magnesium oxide (MgO) or aluminum oxide (AlOx). In some embodiments, the thickness T1 of the barrier-layer 122 is in a range from about 0.5 nm to 2 nm.

In some embodiments, the free-layer 123 may include a single layer or a composite layer. In some embodiments, the free-layer 123 may include a single layer of, for example, iron (Fe), cobalt (Co), nickel (Ni), gadolinium (Gd), terbium (Tb), cobalt iron boron (CoFeB) alloy, or cobalt iron (CoFe) alloy. In some embodiments, the free-layer 123 may include a composite layer of, for example, cobalt iron boron (CoFeB) alloy/tantalum (Ta)/cobalt iron boron (CoFeB) alloy or cobalt iron (CoFe) alloy/tantalum (Ta)/cobalt iron (CoFe). In addition, in some embodiments, the thickness T2 of the free-layer 123 is in a range from about 1 nm to about 3 nm.

In some embodiments, the heavy-metal layer 130 may be made of a material including Tantalum (Ta), Tungsten (W), Platinum (Pt), Palladium (Pd), Hafnium (Hf), Niobium (Nb), Molybdenum (Mo), Gold (Au) or an alloy thereof, but not limited thereto. In some embodiments, the thickness T3 of the heavy-metal layer 130 is smaller than about 10 nm.

The conductive layer 140 is formed under the heavy-metal layer 130. The conductive layer 140 includes a first conductive portion 141 and a second conductive portion 142 separated from each other, and the first conductive portion 141 and the second conductive portion 142 are connected to two ends of the heavy-metal layer 130. The conductive layer 140 has an electric conductivity higher than that of the heavy-metal layer 130. In comparison with the structure without the conductive layer 140, the conductive layer 140 in the present embodiment could increase the electric conductivity of the whole of the heavy-metal layer 130 and the conductive layer 140, and thus it could decease the driving voltage for the electrical current L1 of FIG. 1 and the electrical current L2 of FIG. 2. In addition, in an embodiment, the conductive layer 140 is made of a material including Ag, Cu, Au, Al or combination thereof.

As illustrated in FIG. 1, in a write program, the electrical current L1 is applied to flow through the first conductive portion 141, the heavy-metal layer 130 and the second conductive portion 142 in order for switching the state of the free-layer 123 of the MTJ layer 120 to state "1" from state "0" (or to state "0" from state "1"), wherein the state "0" represents that, for example, the magnetization directions of the pinned-layer 121 and the free-layer 123 are the same, and the state "1" represents that, for example, the magnetization directions of the pinned-layer 121 and the free-layer 123 are opposite.

As illustrated in FIG. 2, in another write program, the reverse electrical current L2 is applied to flow through the second conductive portion 142, the heavy-metal layer 130 and the first conductive portion 141 in order for switching the state of the free-layer 123 of the MTJ layer 120 to state "0" from state "1" (or to state "1" from state "0").

In FIGS. 1 to 3, the read voltage $V_R$ is applied between the top electrode 110 and the first conductive portion 141 or between the top electrode 110 and second conductive portion 142 to read the parallel (P) state or anti-parallel (AP) state resistances during the write operation. In an embodiment, the required read voltage $V_R$ is, for example, 0.1 Volt (V), more or less.

Since the conductive layer 140 is made of a material different form that of the heavy-metal layer 130, the conductive layer 140 could serve as an etching stop layer for obtaining accurate thicknesses of the heavy-metal layer 130. In the present embodiment, the thickness T3 of the heavy-metal layer 130 could be accurately controlled in range of 3 nm-10 nm.

As illustrated in FIG. 1, the conductive layer 140 has a second upper surface 140u exposed from the heavy-metal layer 130. In other words, as illustrated in FIG. 1, the conductive layer 140 extends beyond the lateral surface 130s of the heavy-metal layer 130, the first lateral surface 122s of the barrier-layer 122 and the second lateral surface 123s of the free-layer 123.

As illustrated in FIG. 1, the insulation layer 150 fills up an interval SP1 between the first conductive portion 141 and the second conductive portion 142 and formed under the first conductive portion 141 and the second conductive portion 142.

Figure 8:
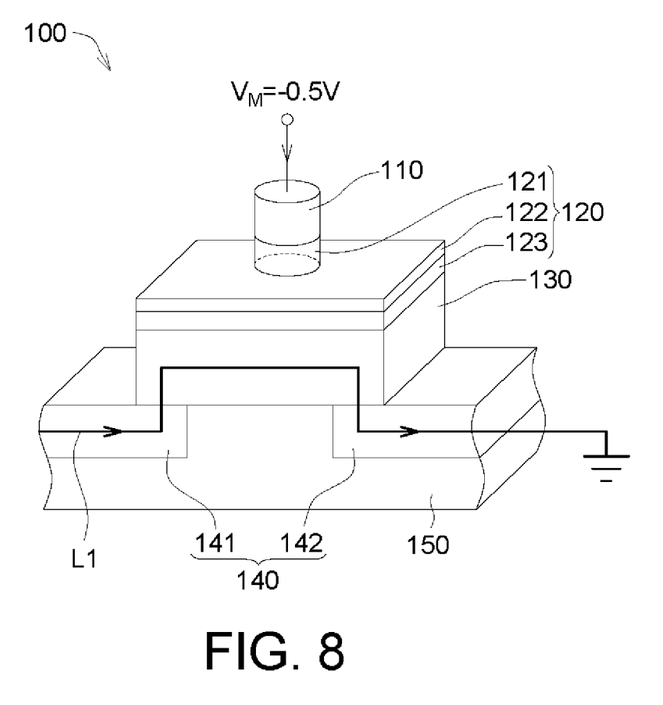
Figure 9:
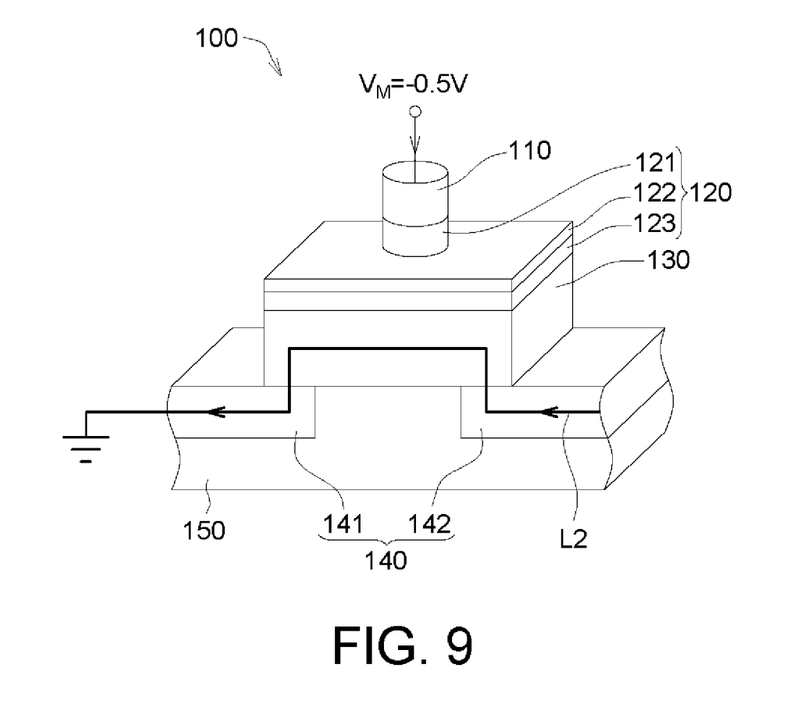
Figure 10:
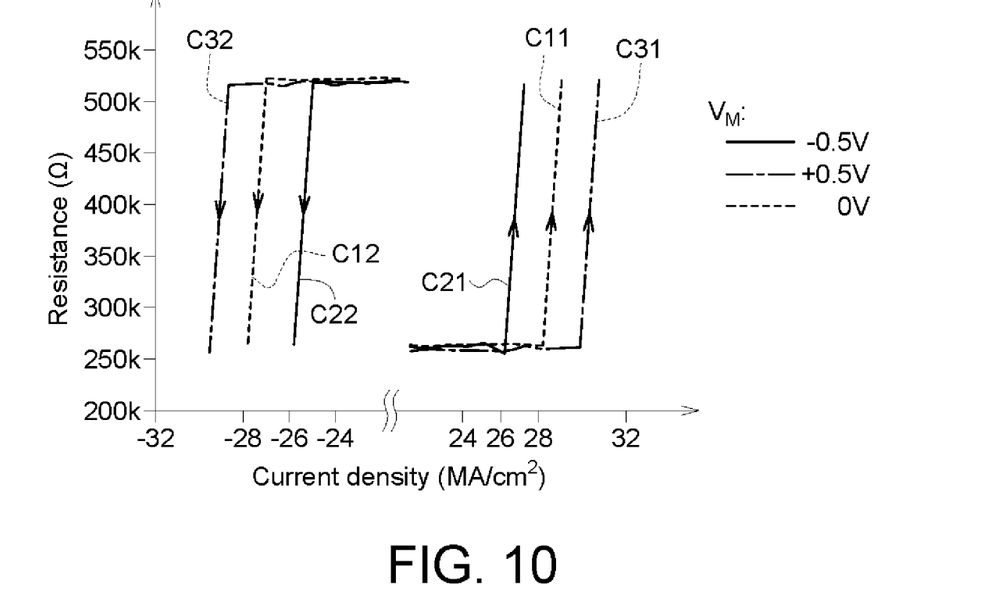
FIG. 10 illustrates a schematic diagram of resistance versus current density (R-J) curve for the magnetic memory structure.

Referring to FIGS. 4 to 10, FIGS. 4 to 9 illustrate schematic diagrams of the magnetic memory structure 100 according to another embodiment of the present disclosure, and FIG. 10 illustrates a schematic diagram of resistance versus current density (R-J) curve for the magnetic memory structure 100.

As illustrated in FIG. 4 to FIG. 9, a modulating voltage $V_M$ is applied, by an external voltage source, to modulate the energy barrier of the MTJ layer 120. Parallelly, the read voltage $V_R$ is applied between the top electrode 110 and first conductive portion 141 or between the top electrode 110 and second conductive portion 142 to read the P state or AP state resistances during the write operation.

Figure 4:
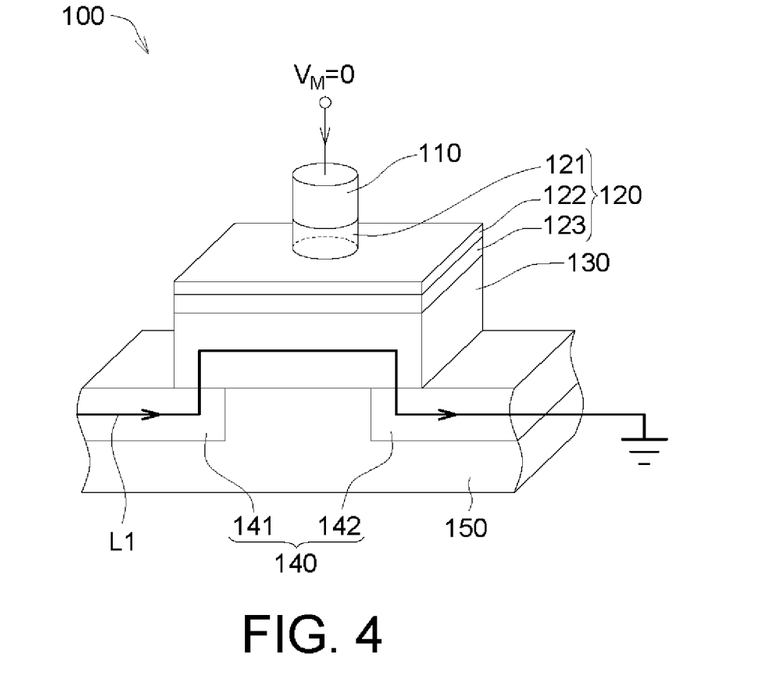
FIGS. 4 to 9 illustrate schematic diagrams of the magnetic memory structure according to another embodiment of the present disclosure.

As illustrated in FIG. 4, in a write program, the electrical current L1 is applied to flow through the first conductive portion 141, the heavy-metal layer 130 and the second conductive portion 142 in order for switching the state of the free-layer 123 of the MTJ layer 120 to state "1" from state "0" (or to state "0" from state "1"), wherein the voltage $V_M$ is "0".

Figure 5:
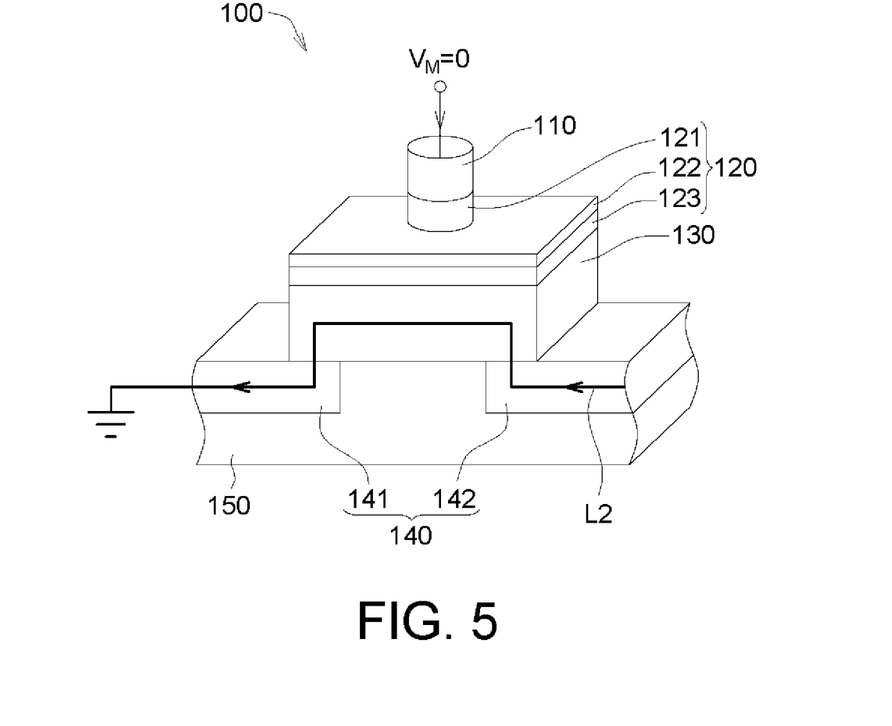

As illustrated in FIG. 5, in another write program, the reverse electrical current L2 is applied to flow through the second conductive portion 142, the heavy-metal layer 130 and the first conductive portion 141 in order for switching the state of the free-layer 123 of the MTJ layer 120 to state "0" from state "1" (or to state "1" from state "0"), wherein the voltage $V_M$ is "0".

Figure 6:
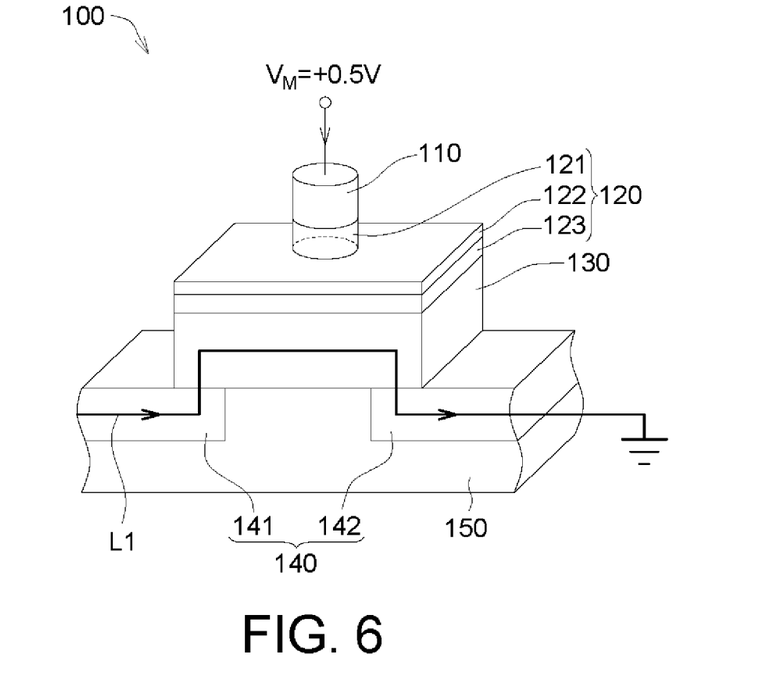

As illustrated in FIG. 6, in a write program, the electrical current L1 is applied to flow through the first conductive portion 141, the heavy-metal layer 130 and the second conductive portion 142 in order for switching the state of the free-layer 123 of the MTJ layer 120 to state "1" from state "0" (or to state "0" from state "1"), wherein the voltage $V_M$ is +0.5 V.

Figure 7:
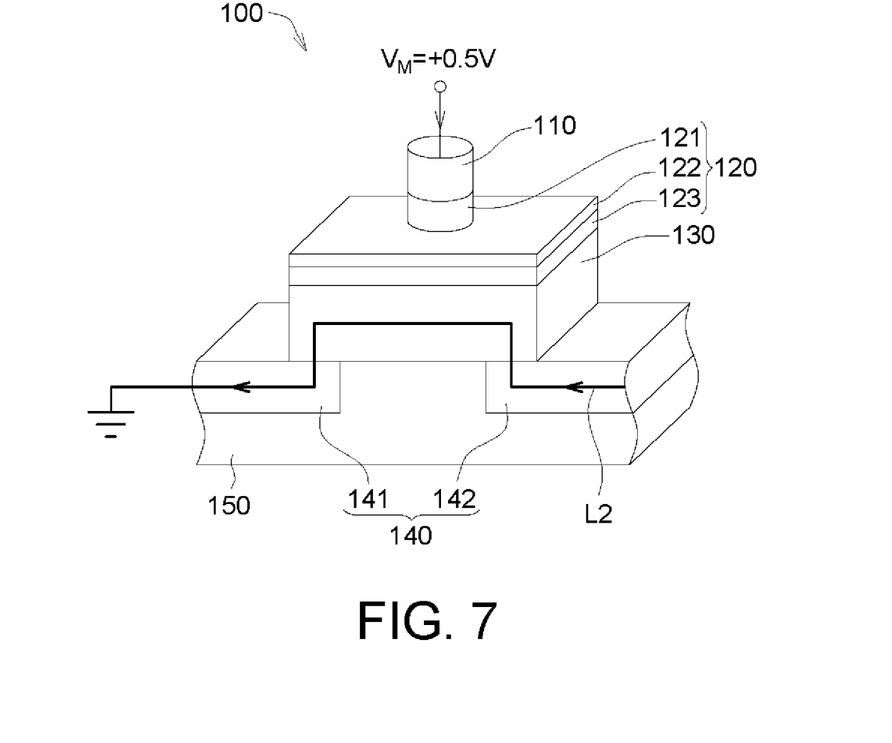

As illustrated in FIG. 7, in another write program, the reverse electrical current L2 is applied to flow through the second conductive portion 142, the heavy-metal layer 130 and the first conductive portion 141 in order for switching the state of the free-layer 123 of the MTJ layer 120 to state "0" from state "1" (or to state "1" from state "0"), wherein the voltage $V_M$ is +0.5 V.

As illustrated in FIG. 8, in a write program, the electrical current L1 is applied to flow through the first conductive portion 141, the heavy-metal layer 130 and the second conductive portion 142 in order for switching the state of the free-layer 123 of the MTJ layer 120 to state "1" from state "0" (or to state "0" from state "1"), wherein the voltage $V_M$ is −0.5 V.

As illustrated in FIG. 9, in another write program, the reverse electrical current L2 is applied to flow through the second conductive portion 142, the heavy-metal layer 130 and the first conductive portion 141 in order for switching the state of the free-layer 123 of the MTJ layer 120 to state "0" from state "1" (or to state "1" from state "0"), wherein the voltage $V_M$ is −0.5 V.

In SOT-MRAM cell, an in-plane current flows through the heavy-metal layer 130. Due to the spin Hall effect (SHE) of the heavy-metal layer, spin-polarized electrons accumulate at the interface of the heavy-metal layer/free-layer, resulting in a transverse pure spin current flowing into the free-layer. Thus, in a SOT-M RAM cell, the spin current does not come from the tunnel barrier and the tunnel barrier does not degrade during write access. As shown in curves C11 and C12 of FIG. 10, the positive current (curve C11) drives the SOT-MRAM cell into a high-resistance state (HRS), while the negative current (curve C12) drives the SOT-MRAM cell into a low-resistance state (LRS). Thus, the free-layer magnetization could be changed by applying electrical current directly through the heavy-metal layer applying external magnetic field. As shown in C11 of FIG. 10, when the current density of the positive electrical current reaches a threshold value (for example, 28 MA/cm² for curve C11 shown in FIG. 10), the state of the free-layer 123 of the MTJ layer 120 is allowed to change. When the current density of the negative current is lower than a threshold value (for example, −28 MA/cm² for the curve C12 shown in FIG. 10), the state of the free-layer 123 of the MTJ layer 120 is allowed to change.

As illustrated in curve C11 and C12 of FIG. 10, when the voltage $V_M$ is 0 V or without bias condition, the threshold value of the switching from P state to AP state and AP state to P state is similar to the switching of SOT-MRAM cell, as described above.

As illustrated in curve C21 or C22 of FIG. 10, when the voltage $V_M$ is −0.5 V bias, the threshold value of the switching from P state to AP state and AP state to P state is reduced, for example, to +26 MA/cm² (for the curve C21) or −26 MA/cm² (for the curve C22) from +28 MA/cm² (for the curve C11) or −28 MA/cm² (for the curve C12).

As illustrated in curve C31 or C32 of FIG. 10, when the voltage $V_M$ is +0.5 V bias, the threshold value of the switching from P state to AP state and AP state to P state is increased, for example, to +31 MA/cm² (for the curve C31) or −31 MA/cm² (for the curve C32) from +28 MA/cm² (for the curve C11) or −28 MA/cm² (for the curve C12).

Figure 11:
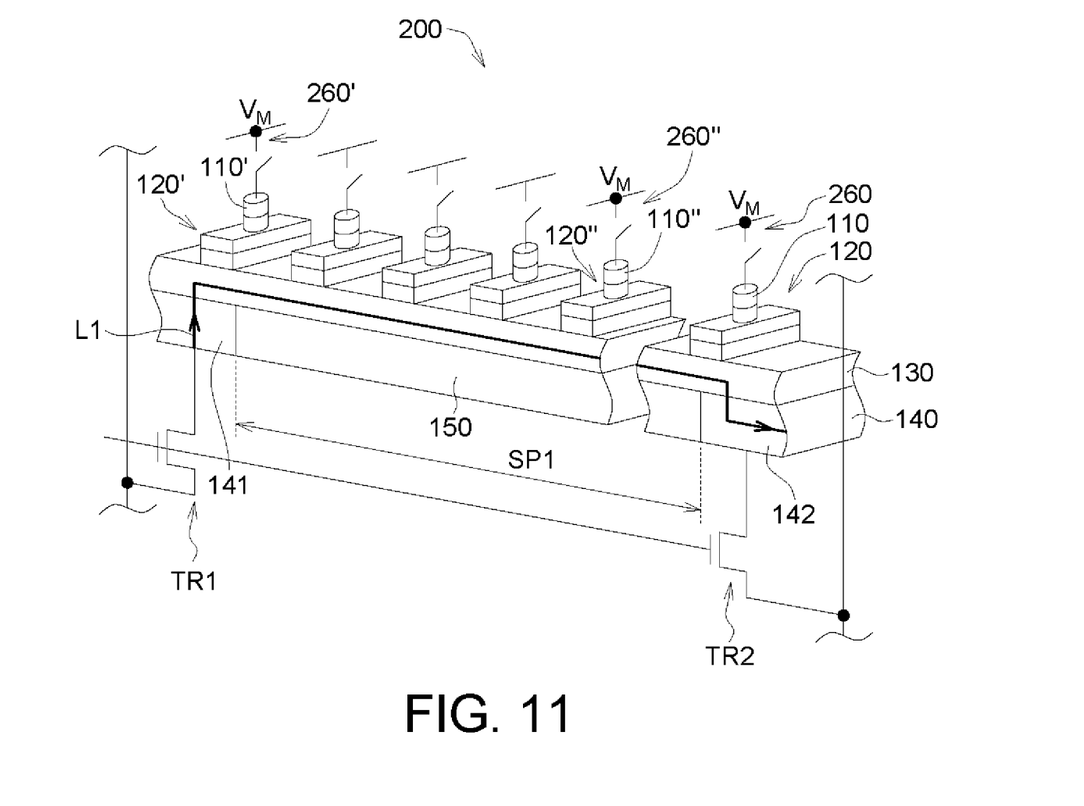
FIG. 11 illustrates a schematic diagram of a magnetic memory structure according to another embodiment of the present disclosure.

For example, as shown in FIG. 11, FIG. 11 illustrates a schematic diagram of a magnetic memory structure 200 according to another embodiment of the present disclosure. The voltage $V_M$ is for controlling threshold modulation effects as described above could be applied for voltage controlled magnetic anisotropy (VCMA)-assisted multibit SOT cell structure for future high-density nonvolatile memory (NVM) applications.

As shown in FIG. 11, one top electrode 110 is formed above the corresponding MTJ layer 120, and one switch 260 is electrically connected with the corresponding top electrode 110 for deciding whether the bias is applied to the top electrode 110.

Referring to FIG. 11, the magnetic memory structure 200 includes a number of the top electrode 110, a number of the MTJ layer 120, the heavy-metal layer 130, the conductive layer 140, the insulation layer 150 and a number of switches 260.

In the present embodiment, the heavy-metal layer 130 is formed under all MTJ layers 120, and the MTJ layers 120 overlap the interval SP1 between the first conductive portion 141 and the second conductive portion 142 up and down. In the magnetic memory structure 200, plural states of plural MTJ layers 120 are controlled to change by the electrical current flowing through two conductive portions (the first conductive portion 141 and the second conductive portion 142).

As shown in FIG. 11, the insulation layer 150 fills up the interval SP1 between the first conductive portion 141 and the second conductive portion 142. In other words, there is no any conductive portion disposed with the interval SP1. In addition, the first transistor TR1 is electrically connected with the first conductive portion 141, and the second transistor TR2 is electrically connected with the second conductive portion 142. The passage of the electrical current L1 to the first conductive portion 141 is controlled by the first transistor TR1, and the passage of the electrical current L2 to the second conductive portion 142 is controlled by the second transistor TR2. In the present embodiment, the states of the free-layers 122 of several MTJ layers 120 could be controlled/switched by only two transistors (first transistor TR1 and the second transistor TR2).

It will be apparent to those skilled in the art that various modifications and variations could be made to the disclosed embodiments. It is intended that the specification and examples be considered as exemplary only, with a true scope of the disclosure being indicated by the following claims and their equivalents.

What is claimed is:
1. A magnetic memory structure, comprising:
   a magnetic tunneling junction (MTJ) layer, comprising:
      a pinned-layer;
      a barrier-layer formed under the pinned-layer; and
      a free-layer formed under the barrier-layer; and
   a heavy-metal layer formed under the free-layer;

wherein the barrier-layer has a first upper surface, the pinned-layer has a lower surface, and an area of the first upper surface is larger than an area of the lower surface.

2. The magnetic memory structure according to claim 1, wherein the lower surface of the pinned-layer is entirely located at the first upper surface of the barrier-layer.

3. The magnetic memory structure according to claim 1, wherein the barrier-layer, the free-layer and the heavy-metal layer have a first lateral surface, a second lateral surface and a third lateral surface, and the first lateral surface, the second lateral surface and the third lateral surface are flush with each other.

4. The magnetic memory structure according to claim 1, further comprises:
   a conductive layer formed under the heavy-metal layer;
   wherein the conductive layer has an electric conductivity higher than that of the heavy-metal layer.

5. The magnetic memory structure according to claim 4, wherein the conductive layer comprises a first conductive portion and a second conductive portion, and the first conductive portion and the second conductive portion are connected to two ends of the heavy-metal layer.

6. The magnetic memory structure according to claim 4, wherein the conductive layer has a second upper surface exposed from the heavy-metal layer.

7. The magnetic memory structure according to claim 4, wherein the heavy-metal layer has a lateral surface, and the conductive layer extends beyond the lateral surface of the heavy-metal layer.

8. The magnetic memory structure according to claim 5, further comprises:
   an insulation layer filling up an interval between the first conductive portion and the second conductive portion.

9. The magnetic memory structure according to claim 5, comprises:
   a plurality of the MTJ layers;
   wherein the heavy-metal layer is formed under all MTJ layers, and the MTJ layers overlap an interval of the first conductive portion and the second conductive portion up and down.

10. The magnetic memory structure according to claim 9, wherein there is no conductive portion disposed with an interval between the first conductive portion and the second conductive portion.

* * * * *